United States Patent
Twerdochlib

[11] Patent Number: 5,134,378
[45] Date of Patent: Jul. 28, 1992

[54] SYSTEM AND METHOD FOR DETECTING FAULTS IN GENERATOR BEARING PEDESTALS AND SEAL INSULATION

[76] Inventor: Michael Twerdochlib, 877 Woodcrest Way, Oviedo, Fla. 32765

[21] Appl. No.: 666,316
[22] Filed: Mar. 8, 1991
[51] Int. Cl.$^5$ .................................................. G01R 31/12
[52] U.S. Cl. ............................ 324/545; 324/158 MG; 324/551; 340/647
[58] Field of Search ............... 324/545, 551, 158 MG; 340/647, 648; 322/99

[56] References Cited

U.S. PATENT DOCUMENTS

| | | | |
|---|---|---|---|
| 3,746,979 | 7/1973 | Kildishev et al. | 322/99 |
| 4,097,794 | 6/1978 | Burrus, Jr. | 324/545 |
| 4,122,388 | 10/1978 | Bernasconi et al. | 324/545 |
| 4,517,839 | 5/1985 | Van Dyke | 324/158 MG |
| 4,746,911 | 5/1988 | Laine | 340/647 |
| 4,851,949 | 7/1989 | Lemak et al. | 324/545 |

Primary Examiner—Kenneth A. Wieder
Assistant Examiner—Maura K. Regan

[57] ABSTRACT

Both a system and method is provided for detecting faults in the insulating interface disposed between the shaft of a generator, and the bearings and seals that rotatably support it that generally comprises a transformer for selectively inducing an alternating electric potential into the shaft while the shaft is stationary, and a voltage meter for detecting whether the transformer-induced voltage is transmitted across the insulating interfaces. The number of wire windings used in the transformer of the system is preferably chosen so that the ac voltage induced in the shaft has substantially the same characteristics as the ac voltage induced by dissymmetry currents when the shaft is rotated by the turbines which drive the electric generator. The system of the invention is capable of not only detecting the existence of an insulation failure, but also its exact location so that only the defective portion of the insulation need be repaired.

24 Claims, 3 Drawing Sheets

SYSTEM AND METHOD FOR DETECTING FAULTS IN GENERATOR BEARING PEDESTALS AND SEAL INSULATION

BACKGROUND OF THE INVENTION

This invention generally relates to devices for testing the effectiveness of an insulating interface within an electrodynamic machine, and is specifically concerned with both a system and a method for detecting faults in the insulation disposed between the shaft and the bearings and seals of an electric generator. In electric generators, the generator and exciter bearing pedestals and generator seals must be insulated to prevent unwanted voltages induced in the generator shaft from creating electric arcs across the generator seals and bearing oil films. Such voltages are created both by electrostatic generation,, and by dissymmetry currents created by non-uniformities in the magnetic fields in the stator. Of the two types of currents, the dissymmetry currents are potentially more destructive, as the amperage associated with such currents is high enough to destroy the generator seals and bearings in a matter of hours. Under normal operating circumstances, the ASGS (active shaft grounding system) helps to prevent the creation of such arcing by means of three conductive brushes which maintain electrical contact with the shaft as it rotates. When these brushes detect that a current of between about 40 and 80 milliamps has begun to flow through the bearing pedestal and shaft seal insulation, they ground out the generator shaft, and at the same time activate an alarm which informs the generator operation that an insulation failure has occurred. The generator unit is then removed from service and disassembled to be fixed.

Unfortunately, the ASGS is only capable of detecting insulation failures when the generator is in service. Moreover, it can only tell the generator maintenance crew of the existence of such a failure, and not the precise location where the failure occurred. Hence, if the generator is taken off-line for insulation repairs, there is no sure way to tell whether or not the repairs were completely effective in reinstating the insulation until the generator is actually placed into active service again. To increase the probability of a successful repair, it has been proposed to merely install double layers of insulation throughout all of the suspect areas. However, such a solution is expensive not only in terms of the effort needed to install a second complete layer of insulation, but also due to the fact that double insulation requires the installation of additional insulation oil line connections to the bearings which increase the chances of an oil leak failure.

Clearly, there is a need for a system which accurately and reliably detects failures in the insulating interface between the generator shaft and the bearing pedestals and seals which rotatably support it that obviates the need for applying double layers of insulation. Ideally, such a system would be able to locate the precise location of such a failure to obviate the need for replacing all such insulation.

SUMMARY OF THE INVENTION

Generally speaking, the invention is both a system and a method for detecting faults in insulation whose function is to prevent an electrical potential induced in the shaft of an electrodynamic machine from creating a destructive current flow through the components that rotatably support and seal the shaft. The invention is particularly applicable to detecting faults in the insulating interface that exists between the shaft of an electric generator, and the bearing pedestal and seals that rotatably support it. The system of the invention comprises a transformer for selectively inducing an ac potential in the shaft when the shaft is at rest which is similar to the dissymmetry voltages which are induced in the shaft when the generator is in service, and a voltage meter for detecting whether the transformer induced voltage is transmitted through the insulation and across the bearing pedestal and seals.

The core of the transformer includes an opening for receiving a portion of the generator shaft in order to artificially induce an ac potential into it. In the preferred embodiment, the core of the transformer is annular, and formed from at least two detachably connectable pieces in order to allow the core to be mounted around a selected section of the shaft. Additionally, the transformer includes between about. 500 and 1000 windings coiled around the annular core so that the core induces ac voltages of between about 0.06 and 0.12 volts when a 120 volt ac potential is applied across the windings. To protect the windings, the core may include one or more recesses around which the windings are coiled. Additionally, in order to minimize inductive losses within the transformer core caused by the generation of eddy currents therein, the core is preferably formed from a plurality of insulated laminations of a ferromagnetic metal.

The voltage detector used to determine whether or not the insulation in the generator is effectively isolating the bearing pedestals and seals from the transformer-induced currents in the shaft may be any one of a number of commercially available voltage meters.

In the method of the invention, a transformer as heretofore described is installed around a section of the generator shaft adjacent to the generator side of the shaft grounding brushes that are located between the generator and low pressure turbine. Next, a 120 volt ac potential is applied across the windings of the transformer in order to induce an ac voltage into the shaft. The voltage meter of the system is then connected to a ground potential on one side (which may take the form of either a generator frame or a grounding brush), and to an area of the generator rotor that is near the insulating interface that is to be tested. Since the shaft acts like the secondary side of such a transformer which is comprised of only a single loop, the amount of ac voltage induced into the shaft may easily be determined by dividing the voltage applied to the transformer by the number of windings present in the transformer. A positive reading on the voltage meter indicates that a failure does not exist in the particular insulating interface being tested. After the test has been completed for one portion of the insulating interface, another portion of the shaft may be tested in the same manner to determine the exact location of any insulation failures.

Alternately, the current through the grounding brush could be monitored. The insulation is determined to have failed if a current flow through the grounding brush is observed.

The system and method of the invention advantageously allows the insulation on the bearing pedestals and seals to be quickly and easily checked in a completely non-destructive manner, as the dissymmetry-like voltages induced in the shaft by the transformer cannot harm the bearings even when they are shorted since the bearings and seals are in hard contact with the shaft.

BRIEF DESCRIPTION OF THE SEVERAL FIGURES

DETAILED DESCRIPTION OF THE PREFERRED EMBODIMENT

Figure 1:
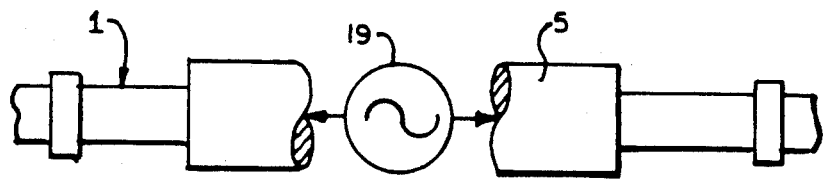
FIG. 1 is a schematic side view of a generator shaft, illustrating the direction of alternating currents induced along the shaft as a result of dissymmetries in stator and rotor fields of the generator.
Figure 2:
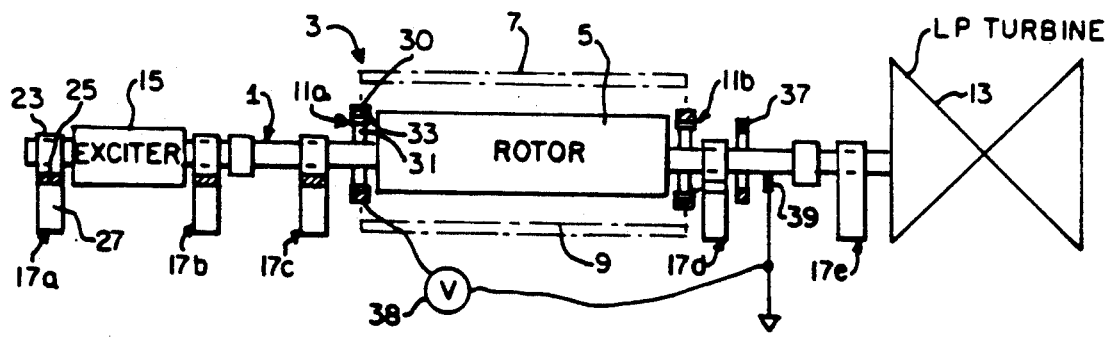
FIG. 2 is a side view of a generator system, illustrating how the shaft that extends through the generator and exciter is rotatably supported by shaft seals in the generator housing, and further illustrating how the system of the invention might be used to check the integrity of the insulation on a shaft seal.

With reference now to FIGS. 1 and 2, the system of the invention is particularly useful in determining whether or not the electrical voltage induced in the shaft 1 of a generator 3 is giving rise to a current being conducted through the bearings and shaft seals which rotatably support the shaft 1 within the generator 3. The shaft 1 includes a rotor 5 which rotates within a housing 7 (illustrated in phantom) which further contains a stator 9. A pair of opposing shaft seals 11$a,b$ rotatably support the shaft 1 within the housing 7. One end of the shaft 1 is ultimately connected to the turbines 13 of the power plant, while the other end of the shaft 1 is connected to the rotor of an exciter 15 which provides electrical current to drive the magnetic field of the rotor 5. Outside of the housing 7, the shaft 1 is rotatably supported by a plurality of bearing pedestals 17$a,b,c,d,e$. Because of the aforementioned dissymmetry voltage when the shaft rotates, it is necessary to electrically insulate the shaft 1 from the generator frame. If this were not done, arcing would occur between the moving components of both the shaft seals 11$a,b$ and bearings 23 located on top of each of the bearing pedestals 17$a,b,c,d,e$. Because of the relatively high amperage associated with dissymmetry currents (as contrasted with electrostatic currents, which are of very low amperage), the current flow that would be conducted across such arcing would severely damage both the shaft seals 11$a,b$ and bearings 23 in a matter of hours. Consequently, an interface of insulating material 25 is interposed between each of the bearings 23 of the bearing pedestals 17$a,b,c,d$, and the support structure 27 which holds it up. Similarly, a layer of insulating material 30 isolates the runner 31 from the ring 33 of each of the aforementioned shaft seals 11$a,b$. When either of these insulating materials 25,30 breaks down or is compromised to allow a current flow of over 80 milliamps or so to occur between the shaft 1, and the generator housing 7 or one of the bearing pedestals 17$a,b,c,d$, the previously described ASGS informs the generator operators that an insulation failure has occurred. However, the ASGS cannot operate when the shaft 1 is not rotating. Accordingly, one of the principal purposes of the invention is to allow the generator operators to make sure that the repaired or replaced insulating materials 25,30 will effectively insulate the shaft seals 11$a,b$ and bearings 23 from currents associated with the dissymmetry voltage induced in the shaft 1 when the generator 1 comes on-line again.

The system of the invention is generally illustrated in FIG. 2, and comprises an annular transformer 37, a voltmeter 38 and a ground potential, which may be a shaft ground brush 39. Such brushes are well known in the art, and brush 39 may be either the ground brush that is normally included within the previously described ASGS, or it may be a brush that has been specially installed onto the shaft 1 for the purposes of the invention. In all cases, it is preferable to install the ground brush 39 at a location between the generator 3, and the turbines 13 so as to obviate the need for applying insulation within the turbine bearing pedestals 17$e$. The voltmeter 38 may be any one of a number of commercially available voltmeters capable of measuring voltages on the order of 10 to 1000 millivolts ac. One end of the voltmeter 38 is preferably connected to the ground brush 39 in order to bring this side of the voltmeter to ground potential, while the other side of the voltmeter is detachably connectable to a portion of the shaft seal 11$a,b$ or the bearings 23 associated with bearing pedestals 17$a,b,c,d$ which are supposed to be insulated from ground potential by the insulating materials 25 or 30. FIG. 2 illustrates how the voltmeter 38 may be used to check the insulation of the shaft seal 11$a$.

Figure 3:
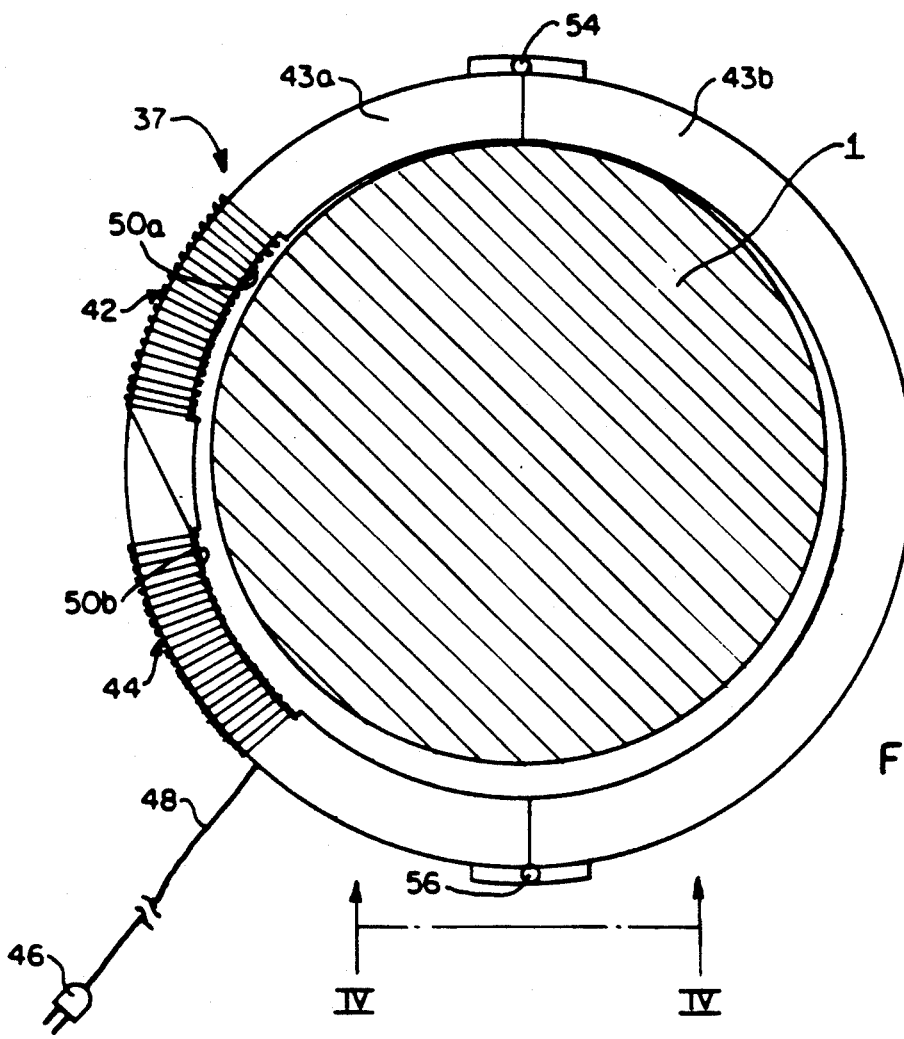
FIG. 3 illustrates how the annular transformer of the system of the invention might be mounted around the shaft of the generator illustrated in FIG. 2.
Figure 4:
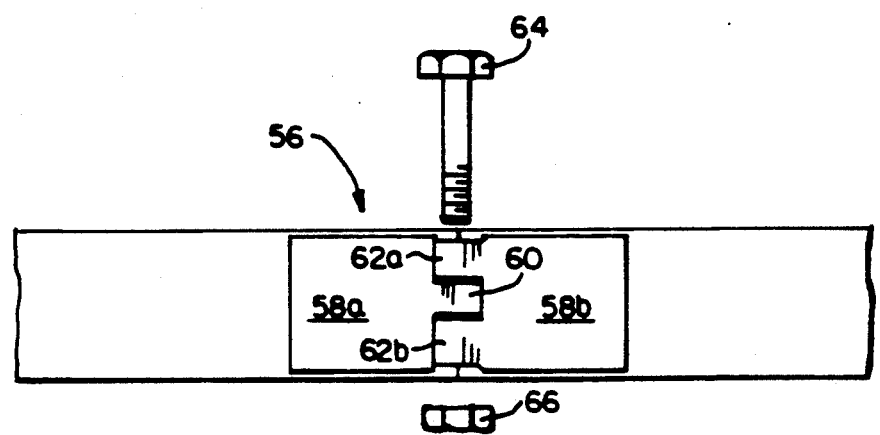
FIG. 4 is a side view of the annular transformer illustrated in FIG. 3 along the line 4-4, showing details of the latch assembly used to open and close the two semi-annular halves of the transformer.

Turning now to FIGS. 3 and 4, the transformer 37 includes an annular core assembly 42 formed from two hingedly connected core halves 43 which are capable of being interlocked around a section of the shaft 1 in much the same fashion as a bangle bracelet is snapped over the wrist of a wearer. A plurality of wire windings 44 are coiled around the middle portion of core half 43$a$. These wire windings form a coil whose input and output are connected to a standard 120 volt plug 46 by means of a double strand of cable 48. Preferably, the wire windings 44 are coiled around recessed portions 50$a,b$ provided in core half 43$a$. Preferably, there are approximately 720 such windings 44. While the number of windings may range between 500 and 1,000, 720 windings is preferred due to the fact that the ac voltage that the annular transformer 37 will induce on the shaft 1 when 720 windings are included will come to about 0.170 volts ac. The provision of such recessed portions 50$a,b$ protects the inner portion of the wire windings 44 by preventing these windings from being squeezed or braided between the annular core assembly 42, and the outer surface of the shaft 1.

Figure 5:
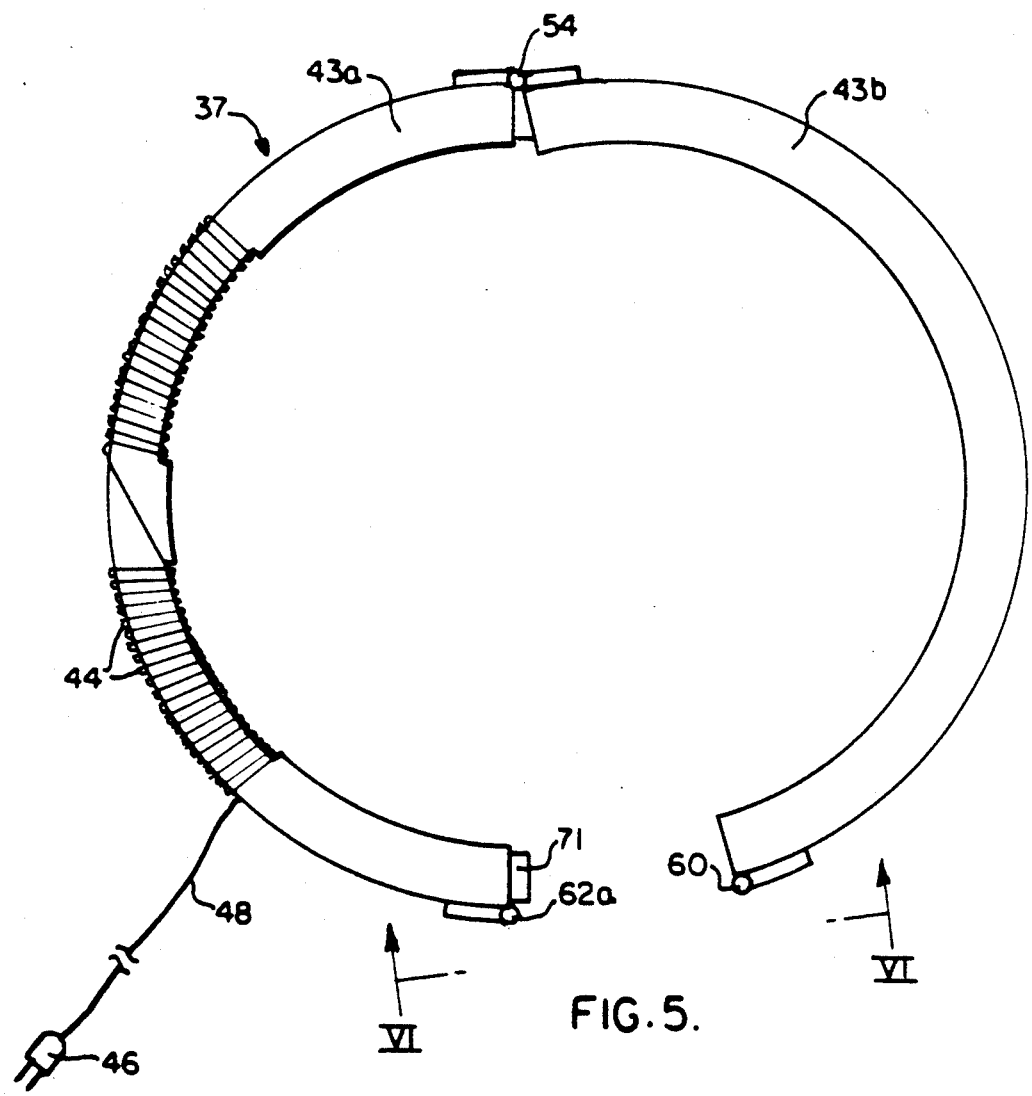
FIG. 5 is a plan view of the annular transformer of the system, illustrating how it appears in its open state, and, FIG. 6 is a side view of the annular transformer along the line 6—6 with the latch assembly and outer insulation removed, illustrating how the core of the transformer is formed from a plurality of insulated laminated plates of a magnetically conductive metal such as soft iron.

With reference now to FIGS. 3 and 5, the upper ends of the two core halves 43$a,b$ are pivotally connected by means of a hinge 54 which allows the core half 43$a$ to be pivoted almost 180°. At the bottom end of the two core halves 43$a,b$, a latch assembly 56 is provided for connecting and disconnecting the lower ends of the two core halves 43$a,b$. With specific reference now to FIG. 4, the latch assembly 56 is formed from a pair of opposing latch plates 58a,b mounted on the lower ends of the core halves 43a,b respectively. These latch plates 58a,b terminate in mutually registerable, interdigitating tubes 60,62a,b through which a latching bolt 64 may be inserted when the tubes 60,62a,b are aligned as shown. A nut 66 may be used to secure the latch assembly 56 together.

Figure 6:
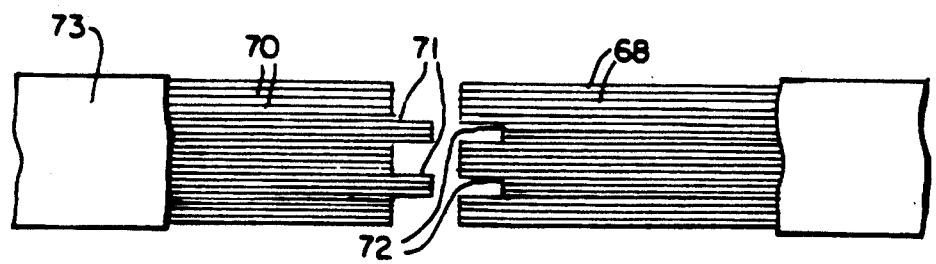

With reference now to FIG. 6, each of the two halves 43a,b of the annular core assembly 42 is formed from hundreds of insulated laminations 68 of a magnetically conductive metal, such as soft iron, in order to prevent eddy current losses from occurring within the annular core assembly 42. Thin layers 70 of an insulating material (which may be wax, plastic, mica, etc.) are preferably interposed between the laminations 68 in order to prevent conductance of such eddy currents. Additionally, in order to insure that no air gaps occur between the ends of the core halves 43a,b which could interfere with the conduction of a magnetic field around the core 42, each of the ends of the two core halves 43a,b may be provided with two or more fingers 71 which are receivable within complimentarily shaped recesses 72. Of course, an outer layer of insulation 73 surrounds the exterior of each of the core halves 43 both in order to insulate the annular core 72 from the shaft 1, as well as to structurally rigidify the stack of laminations 68 which forms the two core halves 43a,b.

In the first step of operating the system of the invention, the latch bolt 64 is removed from the latch assembly 56, and the two core halves 43a,b are pivotally opened with respect to one another and are slipped over the shaft 1 of a generator 3 in the position illustrated in FIG. 3. The latch assembly 56 is then closed by means of the bolt 64 and nut 66. Next, one side of the voltmeter 38 is electrically connected to the previously described ground brush 39. At this juncture, the testing of the insulating material 25,30 present in both the shaft seals 11a,b and bearing 23 is ready to begin. The plug 46 of the annular transformer 37 is plugged into a standard, 120 volt ac power source, such that the annular core assembly 42 and the metal forming the generator shaft 1 coact like a transformer having a 720 turn primary side, and a single turn secondary side. Accordingly, 0.170 volts ac is induced along the longitudinal axis of the shaft 1. The system operator proceeds to test the insulating material 25,30 of the shaft seals 11a,b and bearing pedestals 17a,b,c,d by detachably connecting the left side of the voltmeter 38 to regions of these components which are supposed to be electrically insulated from the shaft 1 by the aforementioned insulating materials. Because the shaft 1 is at rest, no arcing can occur if any of these insulating materials 25,30 defectively conducts the low voltage induced into the shaft 1 by the annular transformer 37. It should be noted that the system of the invention advantageously informs the system operator not only of the existence of a leak in the insulating materials 25,30, but also which specific insulating interface is defective. This constitutes still another significant advantage over the ASGS associated with the prior art, which was only capable of informing the system operator of the existence, but not the location of, a defective insulating interface. Additionally, since most shorts occur while the bearings or seals are being reassembled, the measured voltage (or current) through the shaft brush is preferably constantly monitored during the reassembly process. When a short occurs, this voltage will drop (or current will flow). Thus the immediate cause of the short may be detected. Finally, while the annular core assembly is preferably located in the position shown in FIG. 2 for test purposes, it may also be located near the exciter 15 and gradually moved up the shaft 1 to advantageously detect shorts in any of the insulated bearing pedestals 17 a,b,c,d.

I claim:

1. A system for detecting faults in insulation disposed between the bearings and seals which rotatably support the shaft of an electrodynamic machine, and the structural components which in turn support said bearings and seals where the purpose of said insulation is to prevent an electrical potential created in said shaft when said shaft rotates from creating a destructive current flow through the components that support said bearings and seals, comprising:

means for selectively inducing an electrical potential within said shaft while said shaft is stationary, and means for detecting whether said selectively induced voltage is transmitted through said insulation and across said components.

2. A system as defined in claim 1, wherein said inducing means induces a voltage having substantially the same characteristics as the voltage created in the shaft when said shaft rotates.

3. A system as defined in claim 1, wherein the potential created in the shaft when said shaft rotates is an ac potential, and wherein said inducing means includes a transformer having a core that is inductively coupled to said shaft.

4. A system as defined in claim 3, wherein said detecting means is a voltmeter electrically connectable between a ground potential and said components.

5. A system as defined in claim 3, wherein the core of said transformer includes an opening for receiving a portion of said shaft.

6. A system as defined in claim 3, wherein the core of said transformer is annular, and wherein said shaft is receivable within the opening defined by the inner diameter of said annular core.

7. A system as defined in claim 6, wherein said annular core is formed from at least two detachably connectable pieces to allow said core to be mounted around a selected section of said shaft.

8. A system as defined in claim 3, wherein said transformer includes between about 500 and 1000 windings around said core so that it induces voltages of between about 0.240 and 0.120 volts when a 120 v.ac potential is applied across said windings.

9. A system as defined in claim 3, wherein said transformer includes a plurality of windings, and said core includes a recess for protectively receiving said windings.

10. A system as defined in claim 3, wherein said core includes a plurality of laminations of a ferromagnetic material to minimize inductive losses caused by eddy currents in said core.

11. A system for detecting faults in the insulation between the bearings and seals of an electric generator and the structural components that support them that is designed to isolate said bearings and seals from a ground potential to prevent dissymmetry voltages present in the shaft of the generator from causing a destructive current flow between said bearings and said seals and said structural components, comprising:

transformer means for selectively inducing an electric potential across said shaft while said shaft is stationary, said voltage having substantially the same characteristics as the dissymmetry voltages created when said shaft rotates, and voltage detector means for detecting whether said selectively induced voltage is transmitted through said insulation and across said components.

12. A system as defined in claim 11, wherein said transformer means includes a core that is inductively coupled to said shaft, and between about 500 and 1000 windings coiled around said core for inducing between about 0.170 to 0.240 volts ac in said shaft when a 120 volt ac potential is applied across the windings.

13. A system as defined in claim 12, wherein said core includes a plurality of laminations of a ferromagnetic material to minimize inductive losses caused by eddy currents in said core.

14. A system as defined in claim 12, wherein said transformer includes a plurality of windings, and said core includes a recess for protectively receiving said windings.

15. A system as defined in claim 12, wherein the core of said transformer includes an opening for receiving a portion of said shaft.

16. A system as defined in claim 15, wherein the core of said transformer is annular, and wherein said shaft is receivable within the opening defined by the inner diameter of said annular core.

17. A system as defined in claim 16, wherein said annular core is formed from at least two detachably connectable pieces to allow said core to be mounted around a selected section of said shaft.

18. A system as defined in claim 11, wherein said detecting means is a voltmeter electrically connectable between a ground potential and said components.

19. A system for detecting faults in the inulation betwen the beraings and seals of an electric generator and the structural componetns that support them that is designed to isolate said bearings and seals from a ground potential to prevent dissymmetry voltages present in the shaft of the generator from causing a destructive current flow between said bearings and seals and said structural components as the voltage created when said shaft rotates, comprising:

transformer means for selectively inducing an electric voltage into said shaft while said shaft is stationary, said voltage having substantially the same characteristics as the voltage created when said shaft rotates, including an annular core for circumscribing said shaft, and between about 500 to 1000 windings coiled around said core for inducing a voltage of between about 0.170 and 0.240 volts ac is said shaft when a voltage of 120 volts ac is applied across said windings, and a voltage detector means electrically connectable between said shaft and a ground potential for determining whether or not said induced voltage is transmitted through said insulation and across said shaft.

20. A method for detecting faults in the insulation of the bearings and seals of an electric generator and the structural components that support them that is designed to isolate said bearings and seals from a ground potential to prevent dissymmetry voltages present in the shaft of the generator from causing a destructive current flow between said bearings and said seals and said structural components comprising the steps of:

inducing a voltage into said shaft while said shaft is stationary that has substantially the same characteristics as the dissymmetry voltages created when said shaft rotates, and determining whether said induced potential is transmitted through said insulation and across said shaft.

21. A method as defined in claim 20, wherein said induced electrical potential is an ac potential induced into said shaft by a transformer means.

22. A method as defined in claim 20, wherein said determination of whether said induced potential is transmitted through said insulation is implemented by a voltage meter.

23. A method as defined in claim 20, further including the step of connecting a voltage detection means between said shaft and a ground potential to determine whether said induced potential is transmitted through said insulation.

24. A method as defined in claim 23, wherein said voltage detection means is connected to a portion of each of said bearings and seals that said insulation is supposed to electrically isolate from said shaft in order to determine which particular portion of said insulation is defective.

* * * * *